United States Patent [19]

Fuse et al.

[11] Patent Number: 5,049,518

[45] Date of Patent: Sep. 17, 1991

[54] METHOD OF MAKING A TRENCH DRAM CELL

[75] Inventors: Genshu Fuse, Hirakata; Hirakata, Japan

[73] Assignee: Matsushita Electric Industrial Co., Ltd., Osaka, Japan

[21] Appl. No.: 450,515

[22] Filed: Dec. 14, 1989

[30] Foreign Application Priority Data

Dec. 20, 1988 [JP] Japan .................................. 63-321185
Dec. 23, 1988 [JP] Japan .................................. 63-326574

[51] Int. Cl.$^5$ ........................................... H01L 21/70
[52] U.S. Cl. ....................................... 437/52; 437/38; 437/47; 437/51; 437/60; 437/191; 437/203; 437/233; 437/235; 437/919
[58] Field of Search ...................... 427/38, 47, 52, 60, 427/203, 195, 51, 228, 233, 235, 919, 191, 193; 357/51, 23.6

[56] References Cited

U.S. PATENT DOCUMENTS

| | | | |
|---|---|---|---|
| 4,577,395 | 3/1986 | Shibata | 437/52 |
| 4,734,384 | 3/1988 | Tsuchiya | 437/52 |
| 4,830,978 | 3/1989 | Teng et al. | 357/23.6 |
| 4,921,816 | 5/1990 | Ino | 437/52 |

FOREIGN PATENT DOCUMENTS 0145864  1/1987  Japan .................................. 357/236

OTHER PUBLICATIONS

S. Nakajima et al., "An Isolation-Merged Vertical Capacitor Cell Large Capacity Dram", IEDM 84, pp. 240-243.

D. Kenney et al., "16-MBIT Merged Isolation and Node Trench SPT Cell (Mint)", 1988 Symposium on VLSI Technology, pp. 25-26.

T. Kaga et al., "A 5.4 M$^2$ Sheath-Plate-Capacitor DRAM Cell with Self-Aligned Storage-Node Insulation", 19th Conference on Solid State Devices and Materials, Tokyo, 1987, pp. 15-18.

G. Fuse et al., "SCC (Surrounded Capacitor Cell) Structure for Dram", 19th Conference on Solid State Devices and Materials, Tokyo, 1987, pp. 11-14.

Primary Examiner—Brian E. Hearn
Assistant Examiner—Tom Thomas
Attorney, Agent, or Firm—Stevens, Davis, Miller & Mosher

[57] ABSTRACT

A semiconductor memory, particularly, a dynamic RAM, is provided having a two-cell one-contact memory cell connection structure. A connection portion between memory cells in a silicon substrate of a dynamic RAM, wherein each memory cell has one silicon island enclosed by a trench and provided with two transistor cells within said island, is formed by connecting a polysilicon electrode, enclosing the periphery of the silicon island at the inside of the trench and separated at two portions of the periphery of the silicon island, to the source or drain of one of the two transistor cells of the memory cell. The connection of the polysilicon electrode to the source or drain of the transistor cell of each of two adjacent memory cells can be easily achieved through self aligning by using a fine-trench polysilicon burying method or a selective epitaxial method.

3 Claims, 7 Drawing Sheets

FIG. I
PRIOR ART
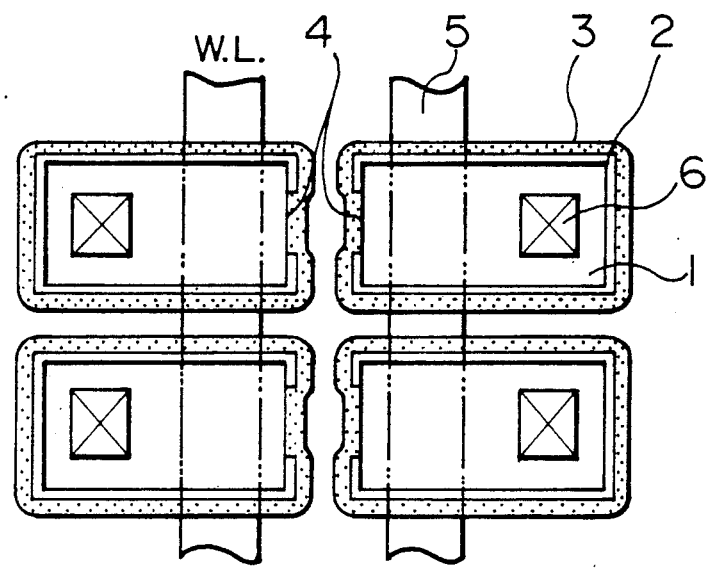
FIG. 2
PRIOR ART
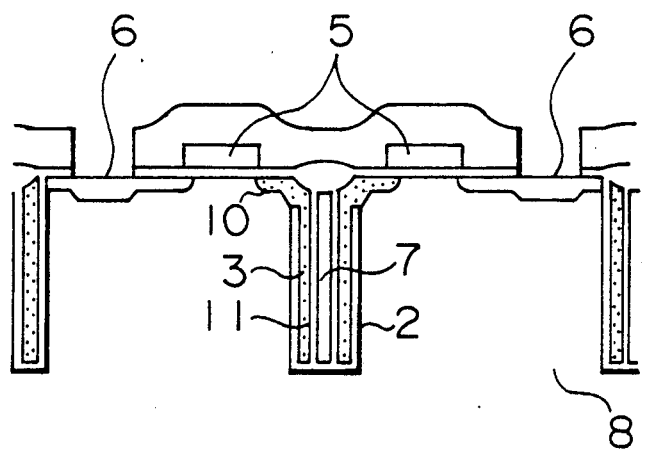

F I G. 5A
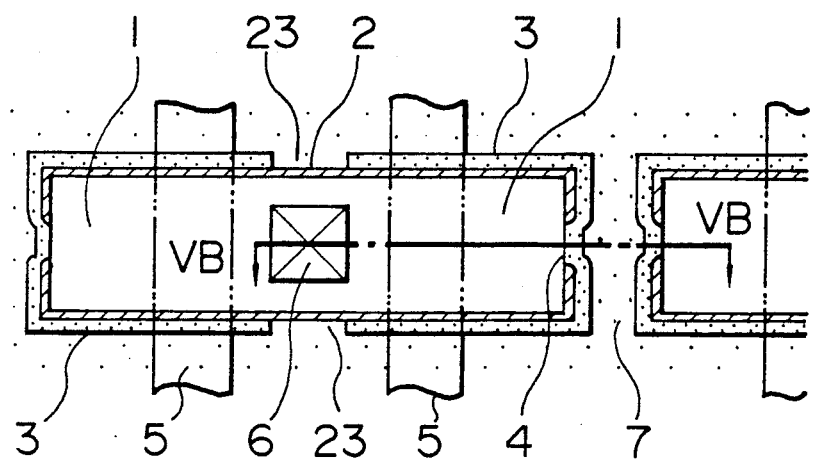
F I G. 5B
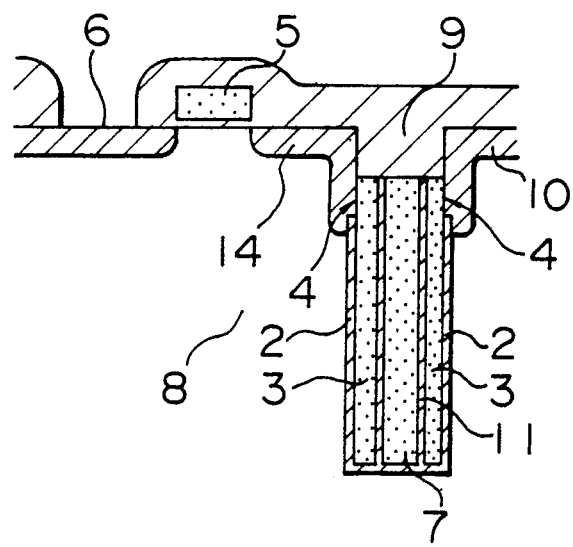

METHOD OF MAKING A TRENCH DRAM CELL

BACKGROUND OF THE INVENTION

The present invention generally relates to a semiconductor memory, and particularly relates to the configuration and production method of a dynamic RAM.

Semiconductor memory cells with a trench capacitor structure have become widely used as the density of the semiconductor memories has increased. FIGS. 1 and 2 show the structure of a typical memory cell. This structure is known as an IVEC (isolation-merged vertical capacitor) cell as reported by Nakajima et al. in IEDM, Lecture No. 9.4, 1984. Cells 1 each enclosed by an oxide film 2 are formed in a silicon substrate 9. A gate 5 and a contact 6 are formed on the upper portion of the cell 1, a contact 4 is provided between the cell 1 and a polysilicon node 3, an insulating film 11 is formed on the surface of the polysilicon node 3, and then a polysilicon plate 7 is formed.

The structure of such a memory cell, however, has the following problems.

That is, since the memory cell has a so-called one-cell one-contact structure, the contact forming portion is large as compared with the case of a so-called two-cell one-contact structure, and the one-cell one-contact structure becomes a large obstruction in making the structure fine. In order to realize the two-cell one-contact structure, however, the semiconductor memory becomes complicated to make it very difficult to put the structure into practical use.

As for a method of producing a dynamic RAM, on the other hand, there has been a problem in that a dynamic RAM has a complicated shape because of its trench capacitor and the process of production thereof is so difficult as to reduce the manufacturing yield. Particularly, there is a serious difficulty in the process of connecting an electrode formed in a trench to a transfer gate.

Two conventionally reported examples of the producing method will be specifically described hereunder.

As one of those examples, MINT reported by D. Kenney et al. of IBM Corp. in 1988 Symposium on VLSI Technology will be described with reference to a perspective view of FIG. 3.

A polysilicon electrode 32 provided in a trench is connected through a strap 37 to a source region 33 of a transfer gate 34. The strap 37 is formed by silicifying titanium by using a self-aligning method.

As another example, the connection method reported in T. Kaga et al.: "A 5.4 $\mu m^2$ Sheath-Plate-Capacitor DRAM Cell with Self-Aligned Storage-Node Insulation", 19th Conference on Solid State Devices and Materials, Tokyo, 1987, pp. 15-18 will be described with reference to FIG. 4. According to this method, a connection portion 48 is selectively provided by burying polysilicon 49 by utilizing the presence of a difference in height between a connection portion of the trench and a non-connection portion. That is, the connection portion 48 is formed by diffusion of phosphorus from the polysilicon 49 into a silicon substrate 41.

In the foregoing conventional producing methods, however, the following problems exist. In the method of FIG. 3, titanium is silicified to form a connection between the polysilicon electrode 32 and the source region 33 by using the strap 37. The silicification of titanium in an ultra-LSI process has a difficult problem in putting the method into practical use, so that the method cannot be used at all in producing memories of LSI circuits. In the connection method of FIG. 4, the process of connection is very difficult to carry out, resulting in problems with respect to manufacturing yields.

SUMMARY OF THE INVENTION

It is therefore an object of the present invention to solve the foregoing problems in the prior art in the configuration of semiconductor memories and in the method of producing semiconductor memories.

First, description will be made as to the configuration of the semiconductor memory of the two-cell one-contact type according to the present invention in which the foregoing disadvantages are eliminated. In the semiconductor memory according to the present invention, a two-cell one-contact structure is formed by laterally separating a polysilicon node on a side wall and by making connection between the polysilicon node and the source or drain of a transfer gate of each cell on the side wall of the cell. In more detail, in a DRAM cell capacitor for two cells having one silicon island enclosed by a trench region in a silicon substrate, a polysilicon node which is a thin polysilicon capacitor storage node encloses the outer surface of a dielectric film on the side wall of the trench, and the polysilicon node is separated at two positions into two polysilicon node portions each connected to the source or drain of one cell. The remaining inner surface portions of the trench are separated from the silicon substrate through an oxide film. A dielectric film is provided on the surface of the polysilicon node, and a polysilicon plate is formed all over the central portion of the trench as a plate. An insulator such as an oxide film or the like is buried in an upper portion of the trench so as to form a device separation portion. Further, in the case where a plurality of two-cell islands are arranged in a staggered manner so as to facilitate formation of a folded bit line, the separation of polysilicon nodes may be made in a manner so that the polysilicon nodes of adjacent two-cell islands are separated at substantially opposite portions of the side walls of the respective trenches corresponding to the adjacent two-cell islands to thereby make it easy to make the separation.

In the method of producing a semiconductor memory according to the present invention, on the other hand, in order to make a connection to a storage polysilicon node in a trench, a portion of a silicon substrate contacting a trench edge is selectively etched to the height of a side wall of the polysilicon node to form a hole, an insulating film on the side wall is removed by etching, and then polysilicon is buried in the previously formed hole by using either a deposition method or a selective epitaxial method or the following method. Thus, the source or drain of a transfer gate is easily connected to the polysilicon node in the trench.

In the method of producing a semiconductor memory according to present invention, the source or drain region of a transistor can be very easily connected to a polysilicon electrode buried for charge storage, by using the conventional trench technique.

BRIEF DESCRIPTION OF THE DRAWINGS

FIGS. 1 through 4 are partial sections each showing the configuration of a conventional semiconductor memory;

FIGS. 5A and 5B are partial sections showing the semiconductor memory according to an embodiment of the present invention;

DETAILED DESCRIPTION OF THE PREFERRED EMBODIMENTS

Figure 3:
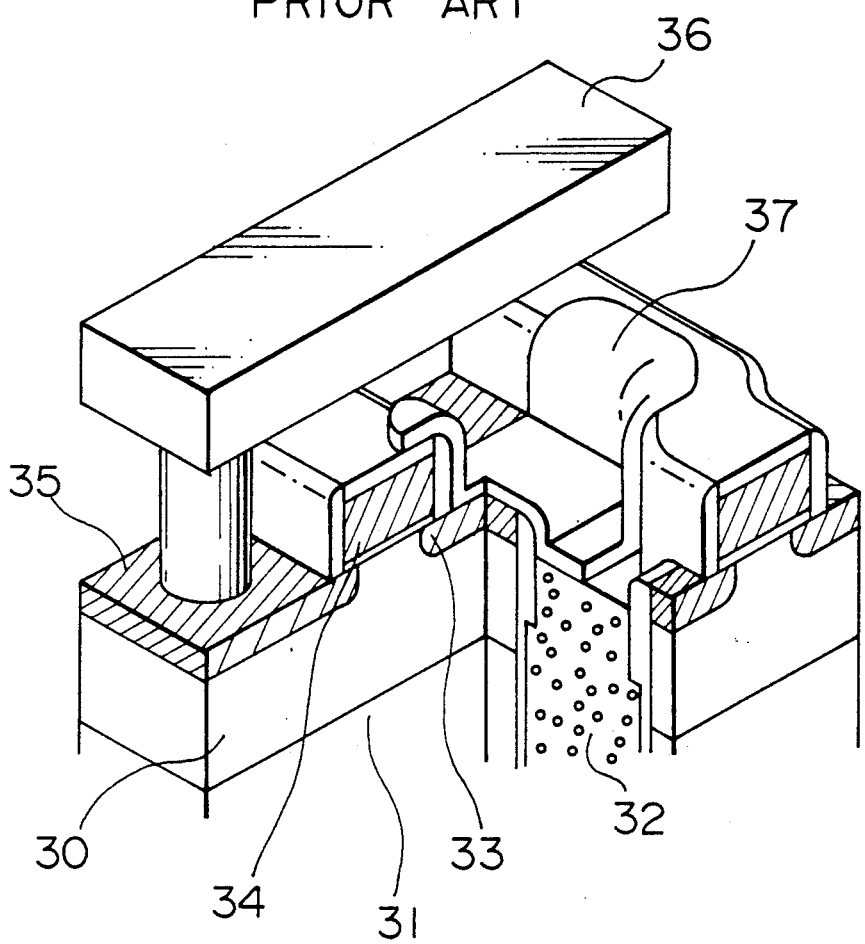
Figure 4:
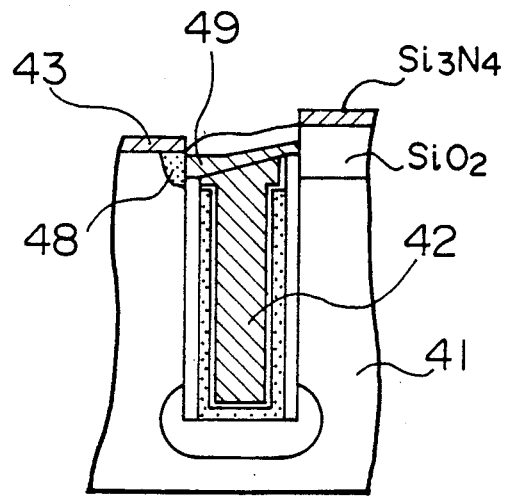

Referring to the accompanying drawings the preferred embodiments of the present invention will be described hereunder.

Referring to FIGS. 5A and 5B, first, a description will be made as to the configuration of the semiconductor memory as an embodiment of the present invention. Two gates 5 and one contact 6 are provided in the upper portion of one silicon island 1 enclosed by a trench region. A polysilicon node 3 is formed on the periphery of the silicon island 1 through a thin oxide film 2, and separation is made in the silicon node 3 at portions of a trench side wall beside the contact 6. The polysilicon node 3 is connected to a source 14 of a transfer gate of one cell through an opening 4 formed through an upper portion of the oxide film 2 as shown in FIG. 5B. Further, a polysilicon plate 7 is formed through a dielectric film 11. An insulator 9 is formed by burying 0.5 μm thick SiO$_2$ in the upper portion of the trench region. The transfer gate is constituted by the source 14 and the gate 5.

In a manner as described above, it is possible to form a peripherally stacked trench type DRAM cell having a two-cell one-contact structure.

Figure 6:
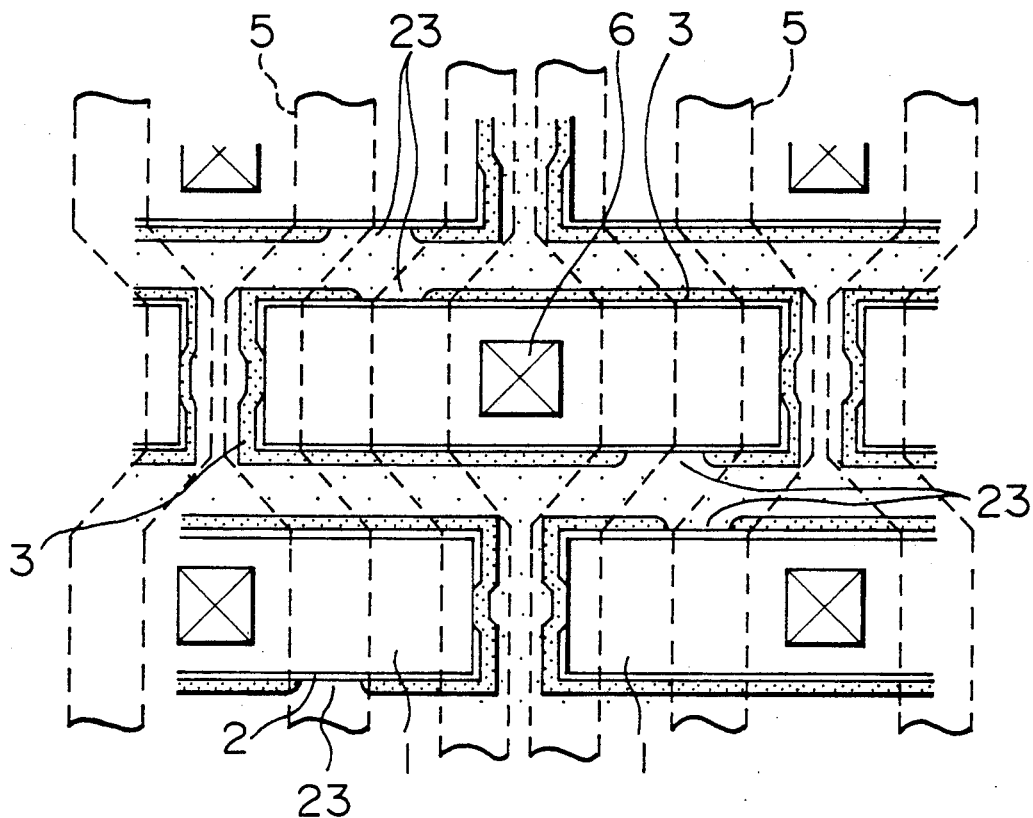
FIG. 6 is a plan showing the configuration of the semiconductor memory according to the present invention.

In the DRAM cell, in the case of forming a folded bit line, it is necessary that silicon islands are arranged in a staggered manner and a transfer gate is alternately formed. FIG. 6 shows another embodiment of the present invention for providing the configuration necessary to form the above-mentioned structure. When separation is made in the polysilicon node 3 on the trench side wall, the separation positions on both opposite sides of the trench may be displaced relative to each other. Accordingly, separation positions 23 may be formed at portions shifted in the longitudinal direction from the central portion of a silicon island of each cell so that the separation positions 23 of the respective polysilicon nodes 3 of adjacent cells may be formed at portions opposite to each other on the respective trench side walls of the adjacent cells. If the transverse (perpendicular to the longitudinal direction) intervals of adjacent silicon islands arranged as shown in FIG. 6 are selected to be not larger than 1 μm, it is difficult to make separation in the polysilicon node 3 only of one silicon island because of difficulty in forming a mask. In the configuration of the semiconductor memory according to the present invention, however, separation of the polysilicon nodes 3 of adjacent silicon islands can be made simultaneously with each other and the portion to be etched is increased in area so that a mask therefor can be formed more easily. Even if the intervals between adjacent silicon islands are selected to be not larger than 1 μm, the process can be performed with no difficulty. The above fact is extremely effective in producing semiconductor memories, and the above configuration of the cells is very important in producing the semiconductor memory.

Figure 7:
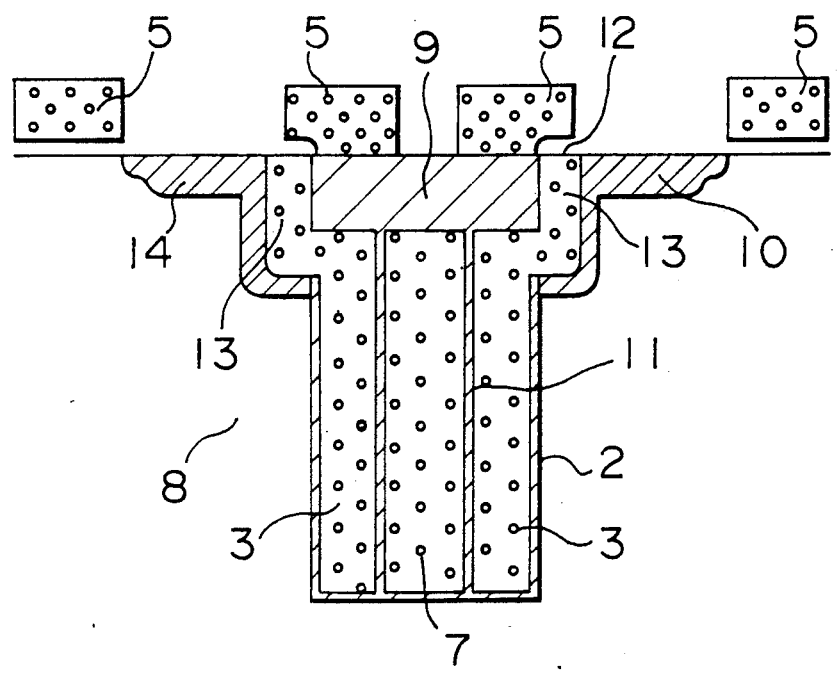
FIG. 7 is a partial section showing the configuration of the memory cell according to another embodiment of the present invention.

Another example of the method of connection between the source 14 and the silicon node 3 and between a drain 10 and the silicon node 3 is shown in FIG. 7. Silicon is etched along a side wall of the buried insulator 9 to reach the lower portion of the height of the buried node so as to form a fine trench 12. Then, connection polysilicon 13 is buried in the fine trench 12 after an opening has been formed through the oxide film 2 to thereby connect the source 14 and the drain 10 with the polysilicon nodes 3, respectively. Other alternative methods may be used in place of the foregoing connection method.

Referring to FIGS. 8A to 8E and FIG. 9, a description will be made as to the method of producing a semiconductor memory according to the present invention.

Figure 8A:
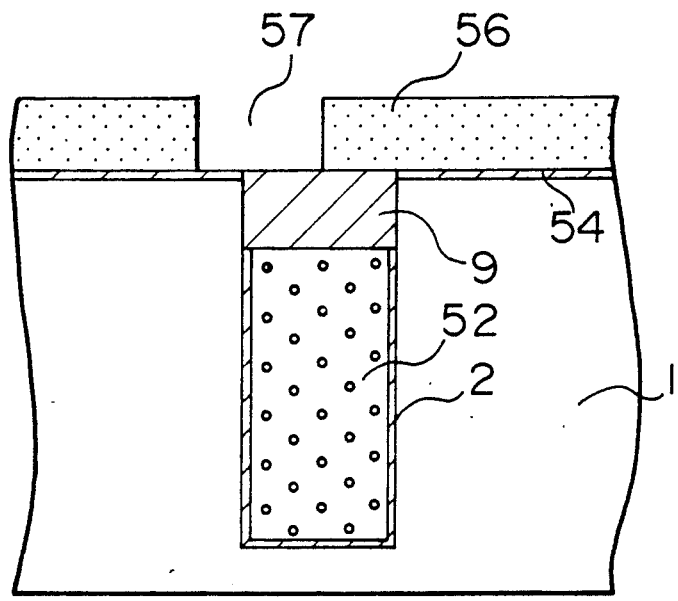
FIGS. 8A through 8E are sections for explaining the steps of the method of producing the semiconductor memory according to the present invention.

First, an embodiment of the semiconductor memory producing method according to the present invention will be described by making reference to the sectional views of FIGS. 8A through 8E for explaining the steps of the method. In the step of FIG. 8A, a trench is formed in a silicon substrate 1, and an oxide film 2 is formed on the inner surface of the trench. Next, a polysilicon electrode 52 functioning as a storage node is buried in the trench. Further, an SiO$_2$ film 9 is buried in an upper portion of the trench. An oxide film 54 is formed on the SiO$_2$ film 9 so that the whole silicon substrate 1 is covered with the oxide film 54. Next, by using a resist 56, an opening 57 is formed at a position contacting the trench edge portion.

Figure 8B:
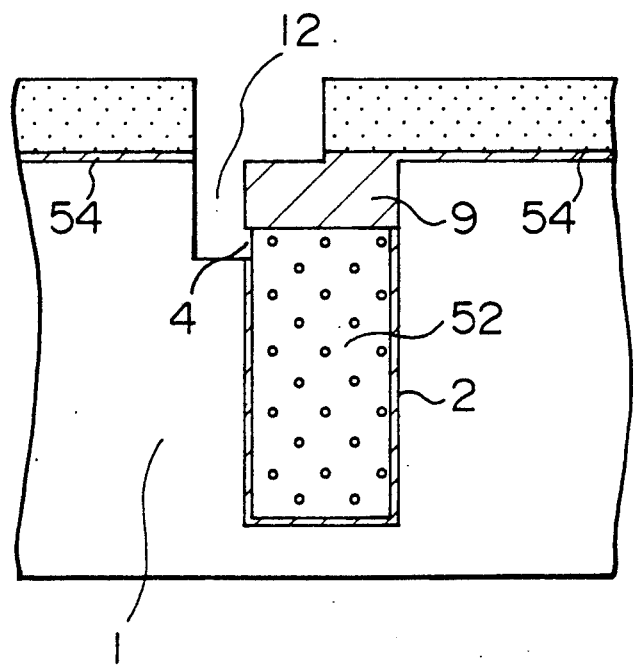

In the step of FIG. 8B, the oxide film 54 is partially removed by selective etching, and at a portion at which the silicon substrate 1 contacts the trench edge portion, the silicon substrate 1 is etched to reach a position lower than the height of the SiO$_2$ film 9 so as to form a fine trench 12 thereat. Then, an upper end portion of the oxide film 2 is partially etched by wet etching so as to form an opening 4 leading to the polysilicon electrode 52.

Figure 8C:
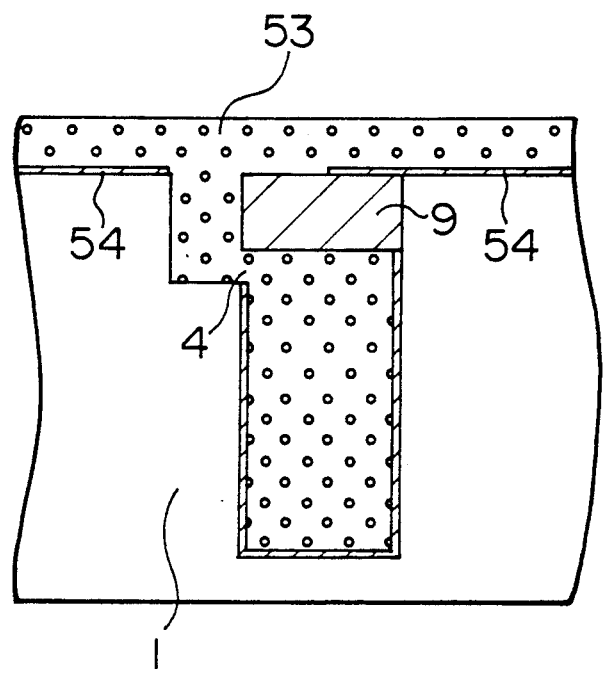
Figure 8D:
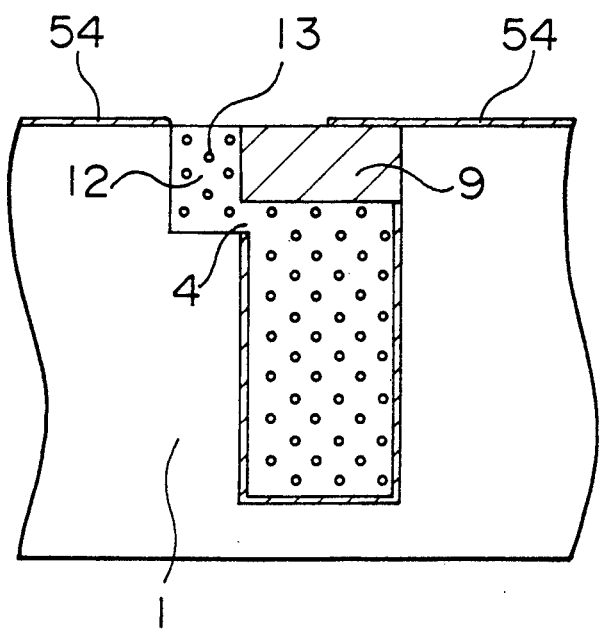

In the step of FIG. 8C, polysilicon 53 is deposited on the upper surface of the silicon substrate 1, and etch-back is effected so as to form such a surface form as shown in FIG. 8D. Then, polysilicon is buried only in the fine trench 12 so as to form fine-trench polysilicon 13.

Figure 8E:
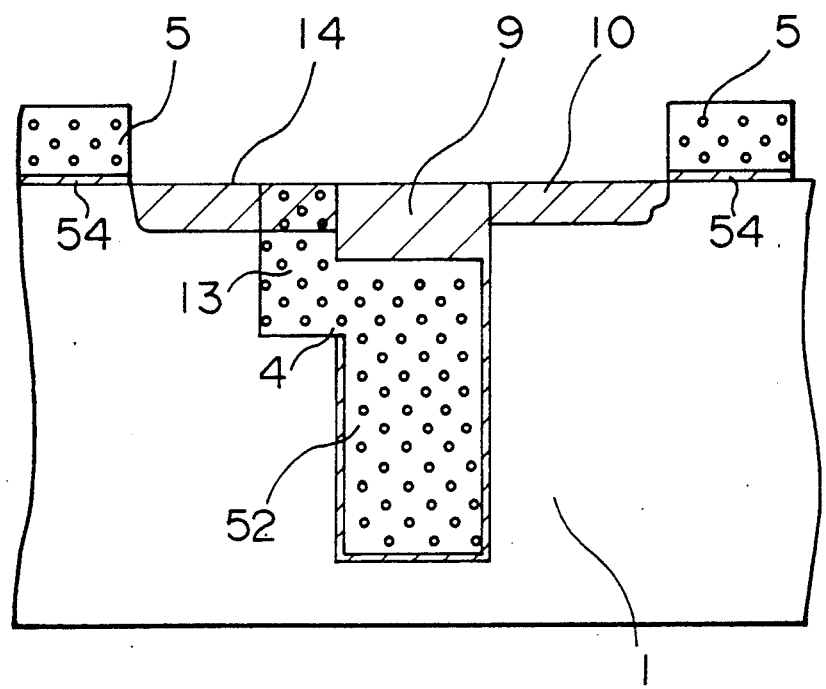

In the step of FIG. 8E, the oxide film 54 is removed, and a transistor which will become a transfer gate is formed. To this end, a gate 5, a drain region 10, and a source region 14 are formed. At this time, the fine trench polysilicon 13 is subject to n$^+$ doping by diffusion of phosphorus from the polysilicon electrode 52 in the trench as well as by diffusion of arsenic from the source region 14. It is therefore possible to easily form an electric connection portion between the source region 14 and the buried polysilicon electrode 52 by the provision of the region of the fine-trench polysilicon 13.

Figure 9:
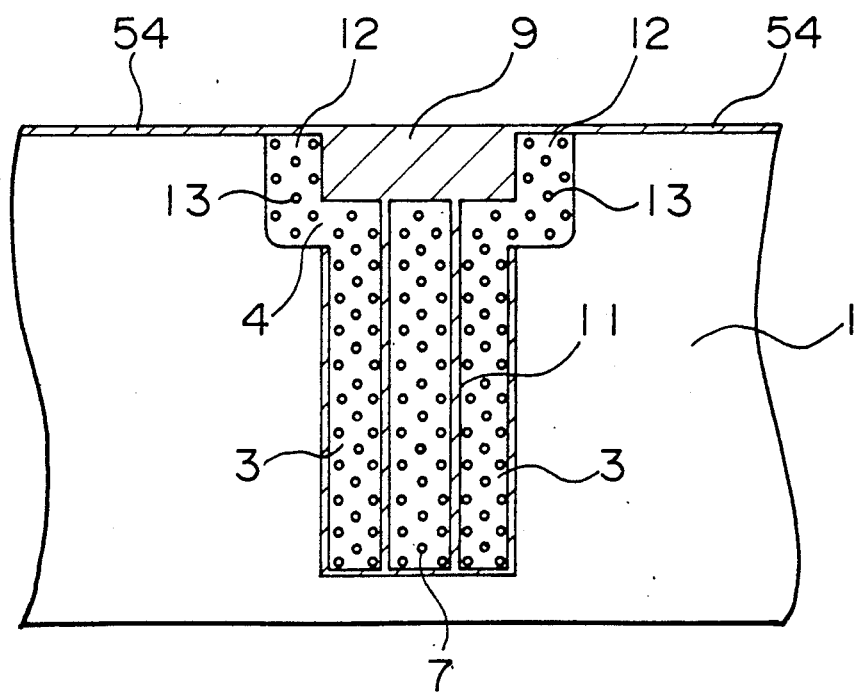
FIG. 9 is a partial section for explaining the method of producing the semiconductor memory according to the other embodiment of the present invention shown in FIG. 7.

FIG. 9 shows that, also in the case where a trench has the same configuration as that of the embodiment of FIG. 7 and a polysilicon plate 7 is formed at the center of the inside of the trench so as to form respective storage nodes 3 for left and right cells, it is possible to form electrical connections at two positions through self aligning by using the producing method described with reference to FIGS. 8A through 8E. Further, a selective epitaxial growth method may be used in place of the method of burying the fine-trench polysilicon.

As described above, in the configuration of the semiconductor memory according to the present invention, it can be expected to reduce the longitudinal pattern width by 1 μm or more as compared with the conventional one-cell one-contact structure. Therefore, the semiconductor memory could be produced with a plane area of 2.4 μm² per cell except wiring by the design rule using a design pattern size of 0.6 μm. Further, since the opening 4 is partially formed through the side wall of the trench, the memory cell region enclosed by the trench can be prevented from electrically floating from the substrate.

Further, the method of producing a semiconductor memory according to the present invention has such an excellent effect that, when a polysilicon storage node provided in a trench is electrically connected to cells on both sides of the trench, electrical connection portions can be formed in a fine portion having a size of 0.5 μm because high alignment accuracy is not required at one of the connection portions, through a self-alignment technique.

What is claimed is:

1. A method of producing a semiconductor memory, comprising at least the steps of:
    (a) forming a trench in a silicon substrate;
    (b) forming an insulating film on the inner surface of said trench;
    (c) burying a first polysilicon material at the inside of said trench to form an electrode through said insulating film;
    (d) burying a first oxide film in said trench and on said first polysilicon material;
    (e) forming a second oxide film over the whole surface of said silicon substrate;
    (f) partially removing said second oxide film adjacent to a side wall of said trench by using a resist so as to form an opening;
    (g) digging-down a part of said silicon substrate at a portion thereof close to said side wall of said trench through said opening down to a position deeper than the top of said buried first polysilicon material to form a hole which reaches a part of said buried first polysilicon material;
    (h) removing a part of said insulating film which has become exposed as a result of the formation of said hole; and
    (i) burying a second polysilicon material in said hole so as to electrically connect said second polysilicon material in said hole with said first polysilicon material in said trench.

2. A method of producing a semiconductor memory according to claim 1, wherein step (c) includes burying said first polysilicon material in said trench in three layers disposed parallel to side walls of said trench so as to include two outer layers and one inner layer, and wherein step (g) includes digging-down two parts of said silicon substrate simultaneously at portions of said silicon substrate close to opposite side walls of said trench to form a pair of holes which reach respective parts of said two outer layers of said three layers of said first polysilicon material in said trench.

3. A method of producing a semiconductor memory, comprising at least the steps of:
    (a) forming a trench in a silicon substrate;
    (b) forming an insulating film on the inner surface of said trench;
    (c) providing a first polysilicon material at the inside of said trench by a silicon selective epitaxial growth method to form an electrode through said insulating film;
    (d) burying a first oxide film in said trench and on said first polysilicon material;
    (e) forming a second oxide film over the whole surface of said silicon substrate;
    (f) partially removing said second oxide film adjacent to a side wall of said trench by using a resist so as to form an opening;
    (g) digging-down a part of said silicon substrate at a portion thereof close to said side wall of said trench through said opening down to a position deeper than the top of said buried first polysilicon material to form a hole which reaches a part of said buried first polysilicon material;
    (h) removing a part of said insulating film which has become exposed as a result of the formation of said hole; and
    (i) burying a second polysilicon material in said hole so as to electrically connect said second polysilicon material in said hole with said first polysilicon material in said trench.

* * * * *